US009246355B2

(12) United States Patent
Korec et al.

(10) Patent No.: US 9,246,355 B2
(45) Date of Patent: Jan. 26, 2016

(54) MOS TRANSISTOR DEVICE IN COMMON SOURCE CONFIGURATION

(71) Applicant: Texas Instruments Incorporated, Dallas, TX (US)

(72) Inventors: Jacek Korec, Sunrise, FL (US); Stephen L. Colino, Bear, DE (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/019,641

(22) Filed: Sep. 6, 2013

(65) Prior Publication Data

US 2014/0001855 A1    Jan. 2, 2014

Related U.S. Application Data

(62) Division of application No. 13/094,596, filed on Apr. 26, 2011, now Pat. No. 8,552,585, which is a division of application No. 11/676,618, filed on Feb. 20, 2007, now Pat. No. 7,952,145.

(51) Int. Cl.
*H02J 9/04* (2006.01)
*H01L 29/417* (2006.01)
*H01L 29/78* (2006.01)
(Continued)

(52) U.S. Cl.
CPC ............. *H02J 9/04* (2013.01); *H01L 29/41766* (2013.01); *H01L 29/7835* (2013.01); *H01L 29/456* (2013.01); *H01L 29/4933* (2013.01); *H01L 2224/16* (2013.01); *H01L 2924/1305* (2013.01); *H01L 2924/13091* (2013.01); *H01L 2924/3025* (2013.01); *Y10T 307/461* (2015.04); *Y10T 307/469* (2015.04); *Y10T 307/625* (2015.04); *Y10T 307/696* (2015.04)

(58) Field of Classification Search
CPC ...................... H01L 29/4933; H01L 29/41766; H01L 224/16; H01L 2224/16; H01L 29/456; H01L 29/7835; H01L 2924/3025; H01L 2924/13091; H01L 2924/1305; H02J 9/04
USPC .................................................. 257/343, 133
See application file for complete search history.

(56) References Cited

U.S. PATENT DOCUMENTS 4,001,860 A    1/1977    Cauge et al.
4,455,565 A    6/1984    Goodman et al.
(Continued)

OTHER PUBLICATIONS

"Trenched Sinker LDMOSFET (TS_LDMOS) Structure for High Power Amplifier Application above 2 GHz," IEEE No. 0-7803-7050-3/01, pp. IEDM 01-887-IEDM 01-890 (Cheon Soo Kim, et al.).

(Continued)

*Primary Examiner* — Howard Weiss
*Assistant Examiner* — Sue Tang
(74) *Attorney, Agent, or Firm* — Jacqueline J. Garner; Frank D. Cimino

(57) ABSTRACT

A semiconductor device includes a semiconductor substrate, a first p-channel laterally diffused metal oxide semiconductor (LDMOS) transistor formed over the semiconductor substrate and additional p-channel LDMOS transistors formed over the semiconductor substrate. First drain and gate electrodes are formed over the substrate and are coupled to the first LDMOS transistor. Additional drain and gate electrodes are formed over the substrate and are coupled to the second LDMOS transistor. A common source electrode for the first and second LDMOS transistors is also formed over the substrate.

6 Claims, 6 Drawing Sheets

(51) Int. Cl.
*H01L 29/45* (2006.01)
*H01L 29/49* (2006.01)

(56) References Cited

U.S. PATENT DOCUMENTS

| | | | |
|---|---|---|---|
| 5,155,563 A | 10/1992 | Davies et al. | |
| 5,156,989 A | 10/1992 | Williams et al. | |
| 5,204,541 A | 4/1993 | Smayling et al. | |
| 5,242,841 A * | 9/1993 | Smayling | H01L 21/823456 148/DIG. 151 |
| 5,252,848 A | 10/1993 | Adler et al. | |
| 5,841,166 A | 11/1998 | D'Anna et al. | |
| 5,907,173 A | 5/1999 | Kwon et al. | |
| 5,911,104 A * | 6/1999 | Smayling | H01L 27/105 257/E21.683 |
| 5,912,490 A | 6/1999 | Hebert et al. | |
| 5,949,104 A | 9/1999 | D'Anna et al. | |
| 6,001,710 A | 12/1999 | Francois et al. | |
| 6,215,152 B1 | 4/2001 | Hebert | |
| 6,372,557 B1 | 4/2002 | Leong | |
| 6,521,923 B1 | 2/2003 | D'Anna et al. | |
| 6,600,182 B2 | 7/2003 | Rumennik | |
| 6,653,740 B2 | 11/2003 | Kinzer et al. | |
| 6,831,332 B2 | 12/2004 | D'Anna et al. | |
| 6,870,222 B2 | 3/2005 | Kim et al. | |
| 7,087,959 B2 | 8/2006 | Shibib et al. | |
| 2002/0145184 A1 | 10/2002 | Perugupalli et al. | |
| 2002/0185681 A1 | 12/2002 | Nakano et al. | |
| 2003/0214012 A1 * | 11/2003 | Kelberlau et al. | 257/500 |
| 2004/0251492 A1 * | 12/2004 | Lin | 257/335 |
| 2005/0017298 A1 | 1/2005 | Xie et al. | |
| 2005/0082610 A1 | 4/2005 | Shibib et al. | |
| 2008/0197411 A1 * | 8/2008 | Korec et al. | 257/343 |

OTHER PUBLICATIONS

"Low Gate Charge 30 V N-Channel LDMOS for DC-DC Converters," International Symposium On Power Semiconductor Devices & ICS (15th: 2003: Cambridge, England, 4 pages (Matsushita, et al.).

"High Power Silicon RF LDMOSFET Technology for 2.1 GHz Power Amplifier Applications," IEEE Proceedings—Circuits Devices Syst., vol. 151, No. 3, Jun. 2004, 4 pages (Baiocchi, et al.).

"High Performance RF Power LDMOSFET Technology for 2.1 GHz Power Amplifier Applications," Microwave Symposium Digest, 2003, IEEE MTT-S International Publication Date: Jun. 8-13, 2003, vol. 1, pp. 217-220 (Xu, et al.).

* cited by examiner

MOS TRANSISTOR DEVICE IN COMMON SOURCE CONFIGURATION

CROSS-RELATED APPLICATIONS

This application is a divisional of U.S. Nonprovisional patent application Ser. No. 13/094,596, filed Apr. 26, 2011, which is a divisional of U.S. Nonprovisional patent application Ser. No. 11/676,618, filed Feb. 20, 2007, now U.S. Pat. No. 7,952,145, issued May 31, 2011, which is hereby incorporated by reference in its entirety.

FIELD OF THE INVENTION

The present invention relates to MOS devices, and more particularly to MOS devices having transistors in common source configurations.

BACKGROUND OF THE INVENTION

Many rechargeable, battery operated systems use common source coupled p-channel MOSFETs (PMOSs) to connect the highest available positive voltage power supply to a supply node while isolating all other power supplies, or to isolate the supply node from all power supplies. These switching elements, which are placed in series with the main current path, cannot cause an excessive voltage drop. A voltage drop of 0.1V is hardly acceptable. If a current level of 1.0 A or higher is required, the switching element must have an on-resistance (Rds,on) below 100 ma Another requirement on the switching components used in battery operated portable devices is size. The components should occupy minimal area on the printed circuit board (PCB) of the device.

Each of the PMOSs of a common source coupled PMOS pair can be implemented as an individually packaged transistor using wafer level packaging (WLP) technology. WLP technology uses solder bumps placed directly on the semiconductor die to minimize wasted area in the transistor footprint normally attributed to the molded package. An integration of independently controlled transistor pairs in a common source configuration into a single device package in an economic way cannot be realized using existing WLP technology while achieving the desired low Rds,on per switch. MOSFETs with vertical current flow have been developed and have advantageous specific resistance (Rds,on x area), but these devices have common drain electrodes, as the semiconductor substrate is used as a drain contact for the individual MOSFETs. As such, these devices cannot be arranged in a common source configuration.

Therefore, a monolithically integrated PMOS transistor pair in a common source configuration is desired.

SUMMARY OF THE INVENTION

A semiconductor device includes a semiconductor substrate, a first p-channel laterally diffused metal oxide semiconductor (LDMOS) transistor formed over the semiconductor substrate and a second p-channel LDMOS transistor formed over the semiconductor substrate. First drain and gate electrodes are formed over the substrate and are coupled to the first LDMOS transistor. Second drain and gate electrodes are formed over the substrate and are coupled to the second LDMOS transistor. A common source electrode for the first and second LDMOS transistors is also formed over the substrate.

In some embodiments, the semiconductor device is a flip chip semiconductor device with conductive bumps corresponding to the electrodes. In other embodiments the source electrode is formed at the back of the die, and the die is molded into a standard plastic package.

In some embodiments, the semiconductor device is used as a power supply switch in a rechargeable, battery operated system. In other embodiments the switch is used to select one of a plurality of electronic loads.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
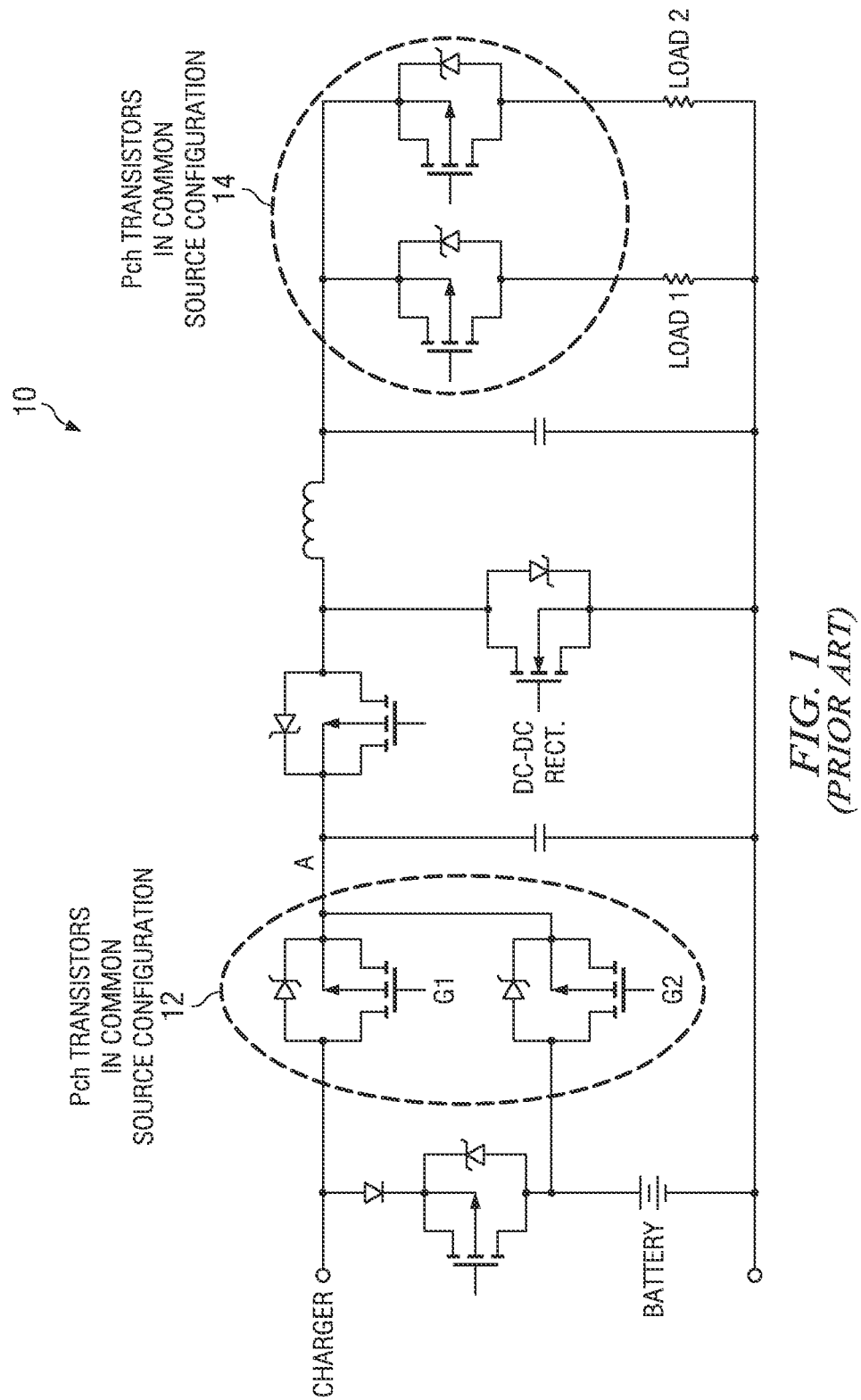
FIG. 1 is a circuit diagram of a prior art switching circuit using p-channel MOS transistors in a common source configuration.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

As used herein, the following dopant concentrations are distinguished using the following notations:

(a) N++ or P++: dopant concentration of about $>5\times10^{19}$ atoms/cm$^3$;

(b) N+ or P+: dopant concentration of about $1\times10^{18}$ to $5\times10^{19}$ atoms/cm$^3$;

(c) N or P: dopant concentration of about $5 \times 10^{16}$ to $1 \times 10^{18}$ atoms/cm$^3$;

(d) N– or P–: dopant concentration of about $1 \times 10^{15}$ to $5 \times 10^{16}$ atoms/cm$^3$; and (e) N–– or P––: dopant concentration of about $<1 \times 10^{15}$ atoms/cm$^3$.

In the following description, numerous specific details are set forth, such as material types, doping levels, structural features, processing steps, etc., in order to provide a thorough understanding of the present invention. Those of ordinary skill in the art will understand that the invention described herein may be practiced without many of these details. In other instances, well-known elements, techniques, features, and processing steps have not been described in detail in order to avoid obscuring the invention. It should also be understood that in the interest of clarity the elements in the figures are representational and are not drawn to scale in the interest of clarity.

Common source coupled p-channel MOSFETs are used to connect the highest available positive power supply voltage to a supply node while isolating all other power supplies, or to isolate the supply node from all power supplies. This is particularly useful in rechargeable, battery operated systems where an external power supply can be attached to operate the system while charging the battery or in the absence of the battery, or the battery can be used to power the system in the absence of the external power supply. The drain of one MOSFET is attached to an external power supply, and the drain of another MOSFET is attached to the battery's positive terminal. The common source is attached to a supply node from which the system draws power.

FIG. 1 shows a power supply section of a cell phone power supply 10. FIG. 1 shows a pair of source-coupled p-channel MOSFETs (PMOSs) for selectively coupling either the charger or the battery to the supply node coupled to the load. In this application the p-channel switches operate as so called synchronous rectifiers in accordance with control signals at their respective gate terminals G1, G2. The individual gates of the PMOS pair 12 in common source configuration are activated to open a channel in parallel to the internal diode and reduce the series resistance of the selected switch as follows:

(a) To connect the charging supply to the supply node A and to isolate the battery from the node A when the charging supply is present and higher in voltage than the battery, or when the battery is not present.

(b) To connect the battery to the supply node A when the charging supply is not present, and to isolate the charging supply from the node A when it is present and its voltage is below that of the battery.

(c) To isolate both the charging supply and the battery from the supply node A if a negative voltage is present on either or both supply terminals, thus providing reverse battery protection.

The switch circuit is placed in series with the main current path and thus should not cause an excessive voltage drop. In many cases, the switching elements should have an on-resistance (Rds,on) below 100 mΩ while occupying minimal area on the PCB.

The improved source-coupled p-channel transistor device described herein may be used as the source-coupled transistor pair in the device 10 of FIG. 1 for selective switching between power supplies, or in other applications familiar to those or ordinary skill in the art. In another example, common source coupled p-channel MOSFETs are used to independently connect or isolate multiple circuit subsystems to a single, positive power node. This is useful to independently switch off, for example, a backlighting, LCD display, or power amplifier when not needed so as to conserve battery charge. The common source is coupled to the power supply node and each drain is coupled to an independent subsystem. Each subsystem is either connected to or isolated from the node by controlling the gate terminals of the source coupled PMOSs. This operation is similar in concept to that of a multiplexer. One such usage is shown by the source coupled transistor pair 14 of FIG. 1, which is used to selectively couple one or both of two loads to the supply node. For ease of illustration, the loads are represented simply as resistors. In contrast to the synchronous rectifier function discussed above, here the internal diode is blocked under the applied bias and the switches operate as regular p-channel transistors.

Figure 2:
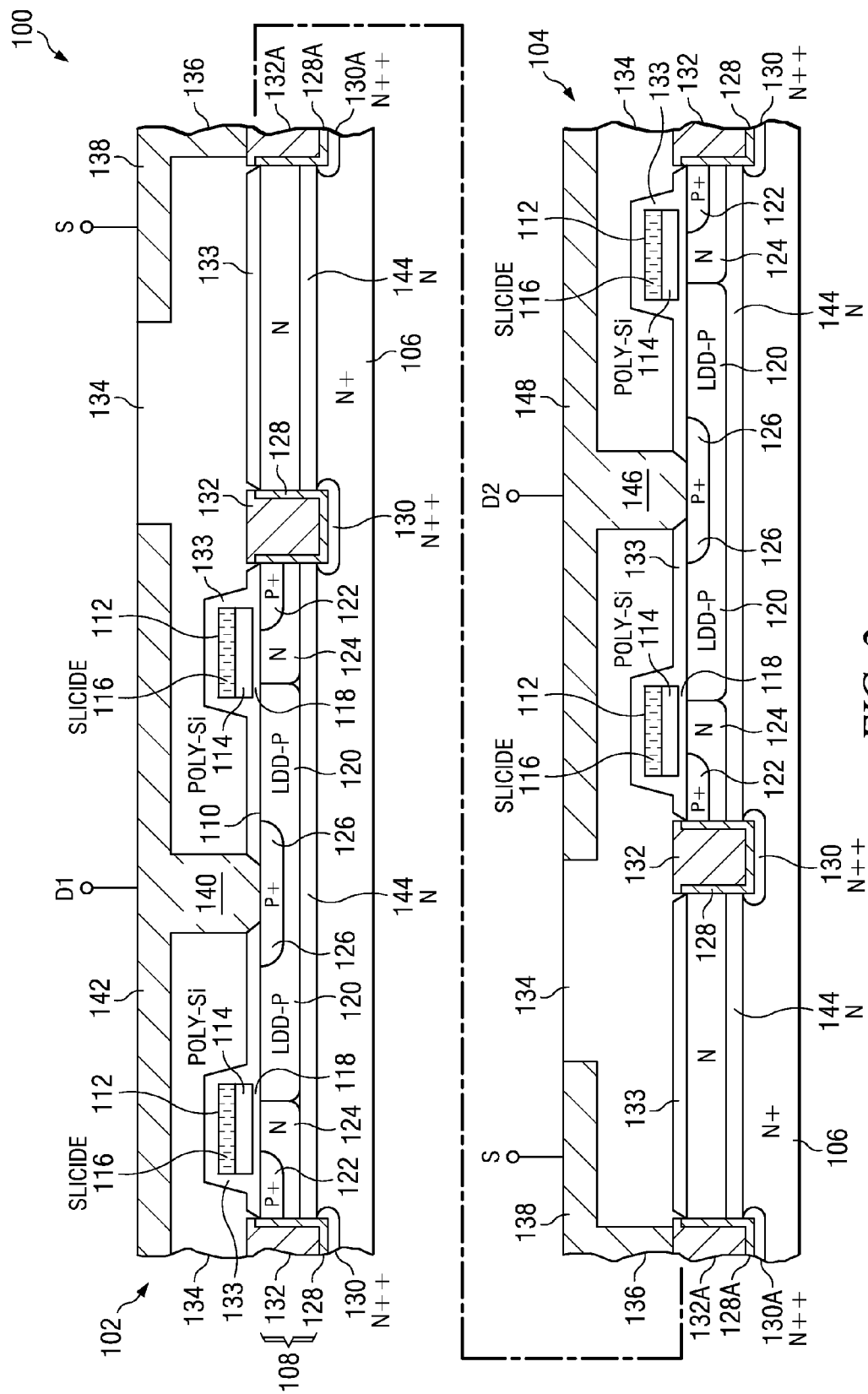
FIG. 2 is a cross-sectional view of a pair of source-coupled LDMOS transistors according to one embodiment of the present invention.

FIG. 2 is a cross-sectional view of the transistor structure of a preferred power switch device 100 having p-channel transistors coupled in a common-source connection. In one preferred embodiment, the PMOS transistors are configured as p-channel laterally diffused MOS (LDMOS) transistors as described in co-pending and commonly assigned U.S. patent application Ser. No. 11/202,968 (the '968 patent application), the entirety of which is hereby incorporated by reference herein, with certain modifications that will become apparent from the following description.

For ease of illustration, the device of FIG. 2 is shown in two parts. FIG. 2 shows a first p-channel transistor 102 that is coupled at a common source terminals to a second transistor 104. More specifically, transistors 102, 104 are p-channel LDMOS power transistors having low Rds,on. Each LDMOS transistor includes one or more active LDMOS cells as described in more detail below.

The device 100 includes a semiconductor substrate 106, which in the illustrated embodiment is preferably a highly doped (N+) silicon wafer doped with arsenic or phosphorous, for example. Highly doped (N+) substrates have lower resistances than P+ substrates, although in alternative embodiments, the substrate 106 may be P+ doped. In exemplary embodiments, the device 100 is formed on a wafer with a plurality of similar devices. WLP techniques are used to form solder bump/ball connections on the wafer. The wafer is then singulated to form individual dies each including a pair of packaged source-coupled PMOS transistors.

Figure 2A:
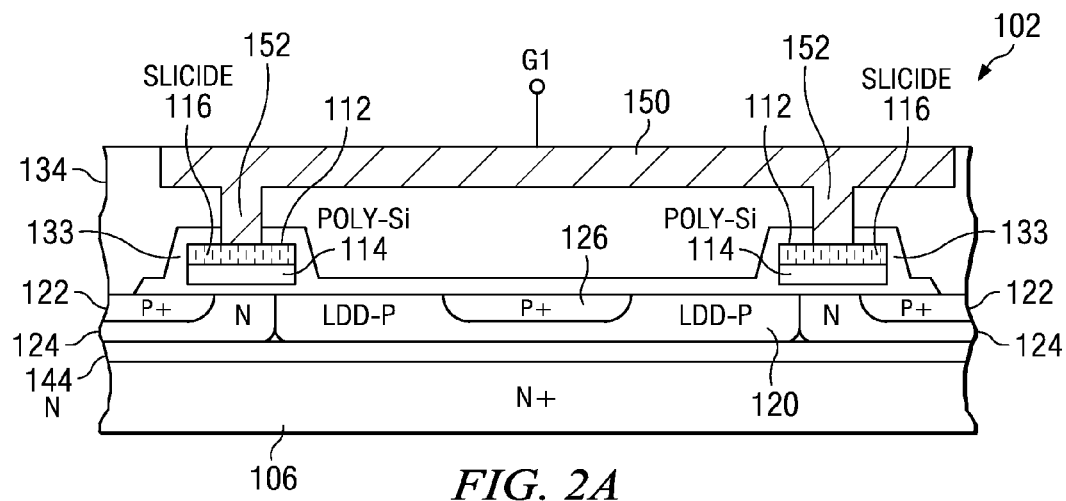
FIG. 2A is a cross-sectional view of a LDMOS transistor from FIG. 2 illustrating the gate electrode connection thereto.
Figure 2B:
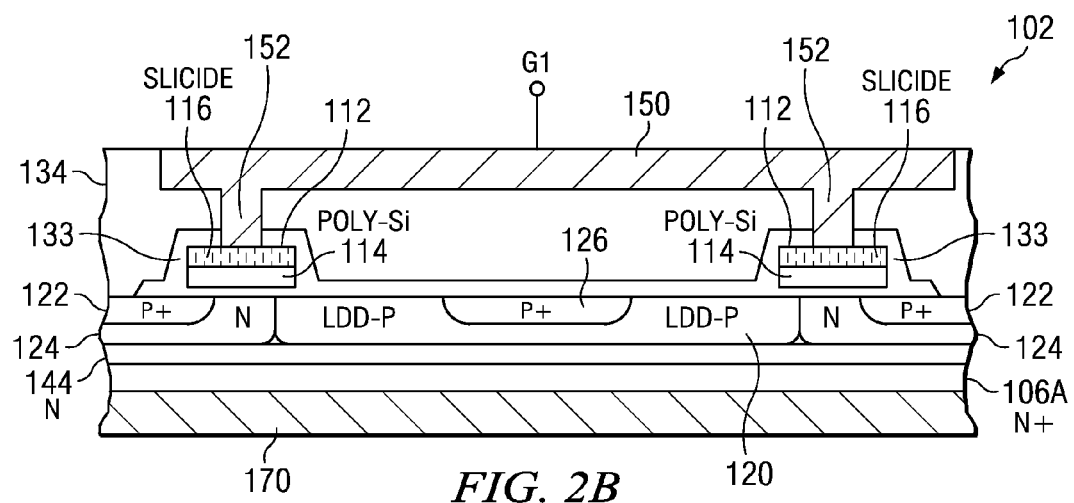
FIG. 2B is a cross-sectional view of an alternative embodiment of the LDMOS transistor shown in FIGS. 2 and 2A.

Referring first to transistor 102, several LDMOS transistors cells are formed on substrate 106 and electrically coupled together to function as a single p-channel LDMOS transistor 102. In an exemplary embodiment, substrate 106 has a thickness of at least 250 µm, thereby providing a very low resistance electrical path for the lateral flow of the transistor current, and thus minimizing the contribution of the substrate 106 to the on-resistance of the transistor 102. In another embodiment, shown in FIG. 2B, the substrate 106A is thin (at or below 100 [tm in thickness) and a thick metal layer 170 is deposited at the backside of the substrate 106A to provide a low resistive path for the lateral current flow.

A lightly doped silicon epitaxial layer 108 is formed over the substrate 106 and has an upper surface 110. In certain embodiments, the epitaxial layer 14 can have dopants of N (arsenic or phosphorous) or P (boron) dopant type and a dopant concentration of N–, N––, P– or P––. In one embodiment, the epitaxial layer has a thickness between about 1.5 to 3.5 µm.

The doping of the epitaxial layer is usually much lower than the doping concentration of the implanted source/drain regions (described below). On the other hand, in case of devices of the prior art with vertical current flow, the background doping of the epitaxial layer is preferably as high as possible in order to reduce the on-resistance between the drain and source (Rds,on) while being just low enough to meet the targeted breakdown voltage of the transistor. With the present LDMOS transistor device 102, however, the original doping of the epitaxial layer 108 has no effect on the resistance of the device because current flows through the vertical source contact region (discussed below). The doping concentration can be kept very low, below $2\times10^{16}$ atoms/cm$^3$, and more preferably at or below $8\times10^{15}$ atoms/cm$^3$, for example.

A conductive gate 112 for transistor 102 overlies the upper surface 110 of the epitaxial layer 108. In the embodiment illustrated in FIG. 2, the conductive gate 112 comprises a lower doped polysilicon layer 114 with an upper silicide layer 116 formed therein or thereover by processes familiar to those in the art. Silicide layer 116 can comprise any transition metal silicide, and in exemplary embodiments is selected from the group consisting of Ti, W and Co. The conductive gate 112 preferably has a thickness between about 0.3 to 0.6 μm and a length defined by the technology generation utilized in its fabrication, e.g., 0.5 μm, 0.35 μm or 0.25 μm, etc. The conductive gate 112 is formed over a gate dielectric 118, which preferably comprises SiO$_2$ formed to a thickness between about 150 to 500 Å.

A drain implant region 126, having dopant concentration P+, is formed in epitaxial layer 108. Lightly doped drain extension region 120 is formed completely within epitaxial layer 108 and forms an enhanced drift region. The enhanced drift region 120 is formed abutting or at least proximate to the upper surface 110 of layer 108 and, in an exemplary embodiment, extends for the thickness of epitaxial layer 108 down to the upper surface of substrate 106 (or, in embodiments, to N buffer layer 144 discussed below). The lightly doped drain region 120 forms a PN junction with the substrate 106 (or N buffer 144) and the more heavily doped drain contact region 126 provides a pre-defined space to pin the location of the electric breakdown of the field transistor. By doing so, it is assured that no hot carriers, which can limit the long term reliability of these devices, are generated in the vicinity of the gate oxide 118. In other words, location of the electric breakdown beneath the drain contact region 126 substantially improves the reliability of the product. The transistor can even operate under avalanche breakdown conditions, which is an important feature for many power applications. The region 120 has a dopant concentration P in the illustrated embodiment. In certain embodiments, lightly doped drain region 120 has a lateral dimension between about 0.4 and 1.2 μm. The region 120 preferably extends below (i.e., is overlapped by) the conductive gate 112 between about 0.05 to 0.15 μm.

The LDMOS transistor 102 also includes a source implant region 122 having a conductivity P+ spaced from the enhanced drain drift region 120. Source region 122 extends laterally between about 0.5 to 0.8 μm, has a depth between about 0.15 to 0.3 μm and also partially underlies the conductive gate 112 between about 0.05 to 0.15 μm. A body region 124 having N-type dopants and having a conductivity of N concentration is formed in epitaxial layer 108 and has a sub-region between the source 122 and enhanced drain region 120, forming a channel region therebetween. In an exemplary embodiment, the body region 124 is formed to a depth preferably equal to about the thickness of the epitaxial layer 108, i.e., it abuts (i.e., lies adjacent to or touches) the heavily doped substrate 112 or the N buffer layer 144 (if present). This feature helps avoid the turn-on of the parasitic bipolar transistor. This event can occur when stored or generated minority carriers have to flow through the body region to the source contact. If the flow of the minority carriers results in a lateral voltage drop larger than 0.7V underneath the source region, this voltage biases the end of the PN junction between the source region and the body region in the forward direction and the NPN bipolar transistor turns on. Such event results in exaggerated heat dissipation and can lead to destruction of the device. The usual way to protect the transistor against the bipolar effect is to insure low resistance of the body region underneath the source implant and to make the lateral extension of the body region as short as possible. However, in the case of the LDMOS transistor 102 or 104 of the power switch device 100, the minority carriers flowing into the body region 124 will flow the shortest path to the substrate 106 (i.e., through body region 124).

The transistor device 100 also includes an insulating layer 133 formed over the source implant region 122, over the sidewalls of the conductive gate 112 (forming side spacers) and its upper surface, as well as over the enhanced drain drift region 120 and drain implant region 126. The insulating layer 133 preferably comprises SiO$_2$ or SiO$_x$N$_y$. It should be understood, however, that insulating layer 133 can comprise several layers of insulating materials collectively forming insulating layer 133. In an exemplary embodiment, insulating layer 133 is formed to a thickness between about 0.1-0.3.

Differences between the design of the LDMOS transistor of the '968 patent application and the transistor 102 of FIG. 2 can be seen in the source contact region. As with the '968 patent application, a conductive trench liner layer 128 is formed along the side walls and bottom surface of a trench formed through the epitaxial layer 108 to the substrate 106. In exemplary embodiments, this conductive layer 128 is formed by a CVD deposition of a silicide layer and subsequent patterning. In some embodiments, the silicide layer comprises polysilicon/W, WSi$_2$, TiSi$_2$ or CoSi$_2$, formed to a substantially uniform thickness between about 0.2 to 0.3 μm. In alternative embodiments, the conductive layer 128 could comprise a silicide (one of the above) and a barrier layer, e.g., Ti/TiN. The layer 128 is deposited or otherwise formed along the side walls and bottom of the trench to make electrical contact with the body region 124 and the source region 122. Unlike the transistor of the '968 patent application, the layer need not be continuous as long as it makes good electrical contact with the body region 124, the source region 122 and a highly doped implant region 130, which has dopant concentration N++ and is formed in the substrate 106. Layer 128 need not be continuous because a conductive plug 132 is formed disposed in the trench to make electrical contact with the conductive layer 128 and thus shorts the source region 122 and body region 128 to the implant region 130, and thus to the substrate 106. In embodiments, the conductive plug 132 can include a conductive material such as doped polysilicon. The conductor element, comprising trench liner 128 and conductive plug 132, has metallic properties and forms ohmic contacts to the body region, source region and to the substrate. A low resistance contact to the substrate 106 is thus provided, improving Rds,on.

Formation of the conductive layer 128 is simplified when compared to the corresponding conductive layer of the '968 application in that it need not be continuous, thereby relaxing processing conditions for its formation. Of course, if the layer 128 is made continuous, plug 132 may be a conductor or may comprise and insulating material. The conductive layer 128 also does not need to extend over the insulating layer as shown and described in the '968 patent application to form a gate shield electrode. The capacitance between the gate 112 and the drain electrode 142 is not a concern with the low speed switching employed by power supply applications such as those of FIG. 1, and thus a shield electrode is not needed. This feature simplifies the manufacturing process.

As mentioned, the transistor cells of each LDMOS transistor 102, 104 are coupled in parallel. The sources 122 of the various LDMOS transistor cells of LDMOS transistor 102 are all coupled to the substrate 106, as are the sources 122 of the various LDMOS transistor cells of LDMOS transistor 104. Current flows along the substrate 106, which is coupled to a source electrode. More specifically, a conductive trench is formed through the epitaxial layer 108 and couples the substrate 106 to a common source electrode 138 by way of highly doped implant region 130A, conductive layer 128A and conductive plug 132A, which are formed along with implant region 130, conductive layer 128 and conductive plug 132.

After formation of the conductive layer 128 and conductive source trench plug 132, a second insulation layer 134 is deposited over the substrate to cover the device. This insulation layer 134 may comprise one or more dielectric layers, and preferably comprises a $SiO_2$ or $SiO_xN_y$ deposited at low temperature and optionally followed by a deposition of BPSG (Boron Doped Phosphosilicate Glass). In exemplary embodiments, the dielectric layer 134 has a thickness defined from the top surface of the insulation layer 133 to its upper surface between about 1.0-1.5 μm.

A source electrode 138 is formed over or within the insulating layer 134 and connected through the insulation layer 134 to the source contact plug 132A by a conductive plug 136. In embodiments, the plug 136 is a Tungsten plug formed in a via and the source electrode is an Al or AlCu metallization line. Various techniques for formation of the plug 136 and line 138 are readily familiar to those in the art and need not be repeated herein in detail. Briefly, a contact opening (called a via) is etched through the insulation layer 134 and insulation layer 133 to expose a part of the source plug 132. A layer of metal, preferably W, is then deposited, such as by CVD, to form a plug. A barrier layer, such as a layer of Ti/TiN may also be deposited before formation of the W plug. Then, the source electrode 138 is formed by sputter depositing a Ti/TiN/Al metal stack and patterning (by CMP or etch) the stack to form a source electrode 138.

Though only one source electrode 138 is shown in FIG. 2, two or more source electrodes could be provided as determined by the necessities of the device size and layout of the drain and gate electrodes. These one or more source electrodes are still coupled together in a common source configuration by the substrate 106.

The drain extension regions 120 are coupled to the highly doped drain region 126. A first drain electrode 142, for the transistor 102, is formed over the insulation layer 134 and connected to the drain implant region 126 by a conductive W plug 140. This first drain electrode 142 is formed at the same time as and in the same manner as the source electrode 138. Likewise, a gate electrode 150 (FIG. 2A) is formed to connect to the gates 112 of the transistor 102 through vias 152.

The final device structure 100 includes a gate electrode 150 and drain electrode 142 of the first transistor 102 and the gate electrode (not shown but similar in structure to electrode 150) and drain electrode 148 of the transistor 104, as well as one or more the common source electrodes 138 formed over the substrate 106 and insulated from one another by the insulation layer 134.

Although only two active LDMOS transistor cells are shown for each transistor 102, 104, it is understood that each transistor can include more than two LDMOS transistor cells, and preferably tens to hundreds of cells, which are connected in parallel to allow handling of large currents.

In one exemplary embodiment, the device 100 includes a buffer region 144 formed in the epitaxial layer 108 between the substrate 106 and the body region 124 and lightly doped drain extension region 120. Preferably, the buffer region 144 is doped at a concentration N equal to or greater than the dopant concentration of the body region 124. The buffer region 144 is preferably formed to a thickness between about 0.3 to 0.6 μm. In one embodiment, the buffer layer 144 is formed by deep implantation of Phosphorous into the epitaxial layer 108 before formation of the gates 112. The buffer layer 144 serves to suppress the well documented short channel effects by helping to ensure that the depletion region does not reach too far into the channel. The buffer layer also provides a means for a better control and reproducibility of the breakdown voltage of the transistor. The breakdown is limited between the contact region 126 and the body region 124, rather than between the drain contact region 126 and the upper surface of the substrate 106. Therefore, the breakdown voltage is not dependent on the thickness of the epitaxial layer 108 or on the doping concentration in the substrate 106, which cannot be controlled as tightly or easily as that of buffer layer 144.

The LDMOS transistor 104 is formed in the same manner as the transistor 102 and shares the common source electrode 138 with the transistor 102. The drain electrode 148 of transistor 104 is coupled to a respective drain implant region 126 by W plug 146. A gate electrode is formed in the same manner as gate electrode 150 of transistor 102.

When the LDMOS transistor 102 is turned "on" by an appropriate control signal at its gate 112, current is collected from the multiple active cells that form the transistor 102 into the substrate 106. More specifically, the conduction current flows through the drain electrode 142, to the drain regions 126, 120 of the cells, laterally through the channels underneath the gates 112 to the source regions 122 and then vertically along the conductive source plugs 132 and/or conductive layer 128 and into the substrate 106, through the substrate 106 to the source plug 132A and into the source electrode 138. A similar flow path for the current of the LDMOS transistor 104 is realized when its gates 112 are appropriately biased to turn "on" transistor 104.

The drain-source resistance (Rds) is optimized by the use of a N+ substrate. As the channel length of devices decreases, particularly p-channel devices, the contribution of the N+ substrate to the on-resistance of the devices becomes increasingly more important. It has historically been much easier to get low resistivity from n-channel devices than from p-channel devices. The embodiment of FIG. 2, however, provides a p-channel device on an n-substrate with lateral current flow.

The above-described LDMOS transistor 102, 104 provides the advantageous switching performance of an LDMOS transistor while introducing a large current handling capability with low specific on-resistance. Further, the improved LDMOS device provides manufacturing advantages, as various elements can be formed from a single, continuous conductive layer. The contribution of the substrate 106 to the overall resistance of the device is advantageously kept at a low level by using substrates having sufficient thicknesses and doping.

The structure of FIG. 2, including the first and second drain electrodes 142, 148, the common source electrode 138, and the first gate electrode 150 and second gate electrode (not shown), is covered by an insulating passivation layer, which is patterned to open electrical contacts for spaced solder bumps to be placed on the top of the die 100. An example of this wafer level processing is described in, for example, U.S. Pat. No. 6,653,740 to Kinzer et al., the entirety of which is hereby incorporated by reference herein.

Figure 3:
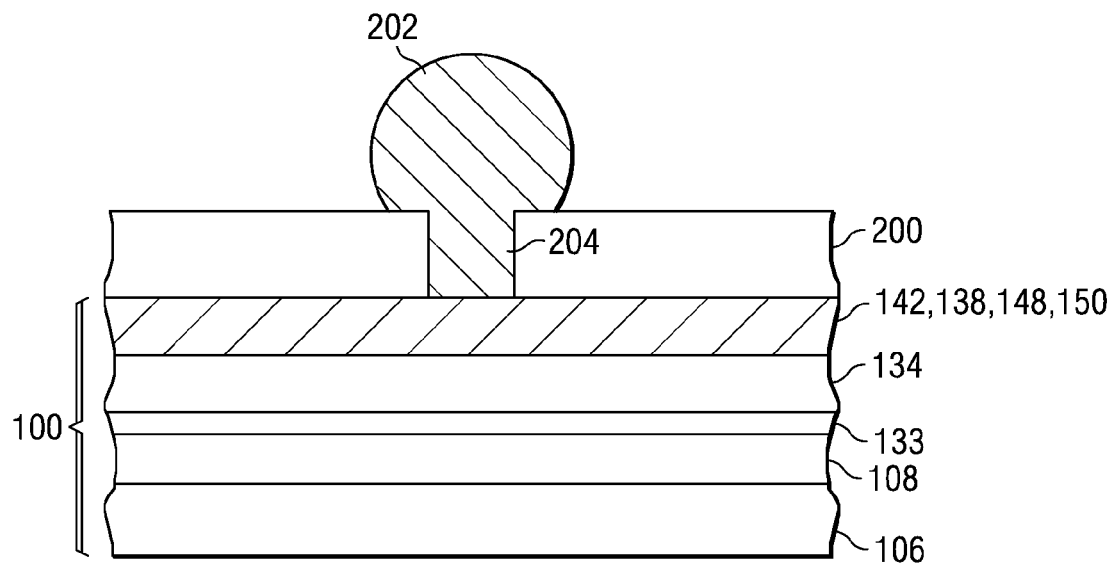
FIG. 3 is a cross-sectional view showing the connection of a solder bump to a metal electrode layer of the device of FIG. 2.

FIG. 3 is a cross-sectional view showing the connection of solder bumps 202 to the device of FIG. 2 using wafer level packaging techniques. After the metal electrode layers 142, 138, 148, 150 are formed, a silicon nitride (or other dielectric) passivation layer 200 is deposited over the device. The passivation layer is then patterned to leave 5 or 6 openings per die each with a pitch, for example, of about 250 μm and separated from the nearest opening (i.e, on centers) by about 500 μm. Using techniques familiar to those in the art, the openings are filled with conductive material 204 to make contact to the electrodes 138, 142, 148, 150 and solder bumps 202 are formed on the passivation layer. Two solder bump connections 202 are provided for the gate and drain electrodes of transistor 102. Two solder bump connections are provided for the gate and drain electrodes of the transistor 104. Last, one or two solder bump connections is provided for the common source electrode of the transistors 102, 104. In embodiments, the solder material is Sn/Pb.

Figure 4:
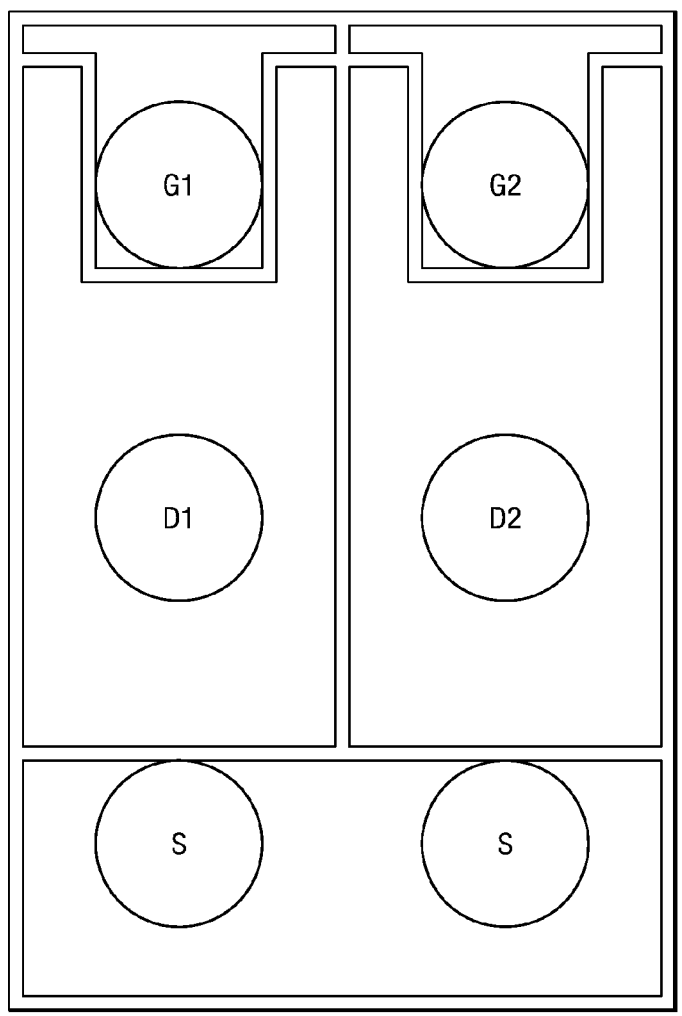
FIG. 4 is a top plan view of a contact configuration for a packaged device having the pair of source-coupled LDMOS transistors of FIG. 2.
Figure 5:
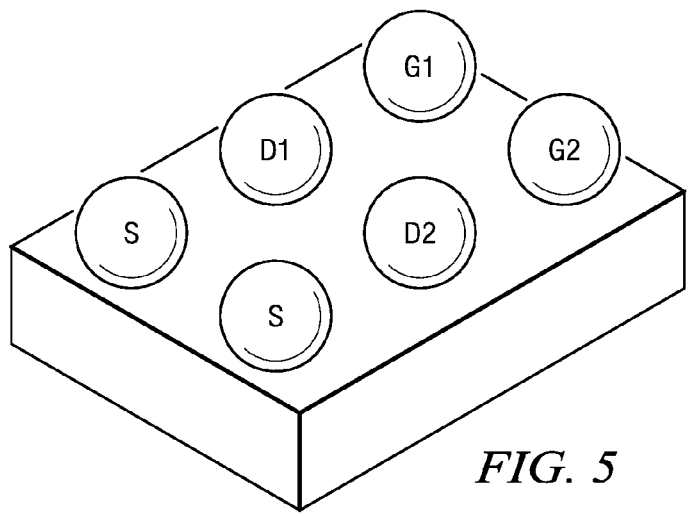
FIG. 5 is a perspective view of the packaged device of FIG. 4.

FIG. 4 shows an example of the possible partitioning of the die area into source, drain and gate segments. FIG. 5 is a perspective view of the final packaged product. The device can be flip-chip bonded to a PCB to operate as a p-channel transistor pair in common source configuration, such as a pair 12 or 14 in the device 10 of FIG. 1 or other devices.

Figure 3A:
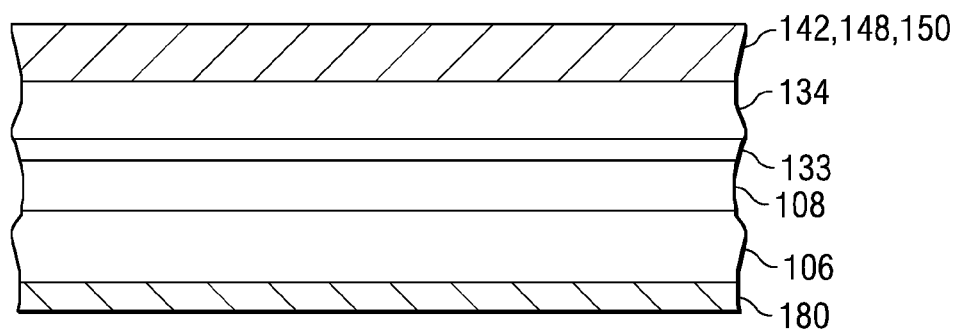
FIG. 3A is a cross-sectional view of an alternative embodiment of the device of FIG. 3.

FIG. 3A shows an alternative embodiment in cross-section of a source coupled PMOS power switch device. The device of FIG. 3A is identical to the device described above in connection with FIG. 3 only the source electrode takes the form of a metal layer 180 formed on the bottom of the substrate 106A. No source electrode is formed over the insulation layer 134. In this embodiments, the substrate is preferably thin, such as 100 μm or less, so as to reduce the contribution of the substrate to the Rds,on of the device. In this embodiment, the trench conductor (trench plug 132A, trench liner 128A and implant 130a) are not needed, nor is source electrode 138 and source via 136. The device of FIG. 3A is then molded in a standard plastic package with appropriate contact leads as will be familiar to those of ordinary skill in the art. In one embodiment, the source electrode 180 is exposed through the package and the gate and drain electrodes of the transistors 102, 104 are coupled to a leadframe or other contact structure.

Figure 2C:
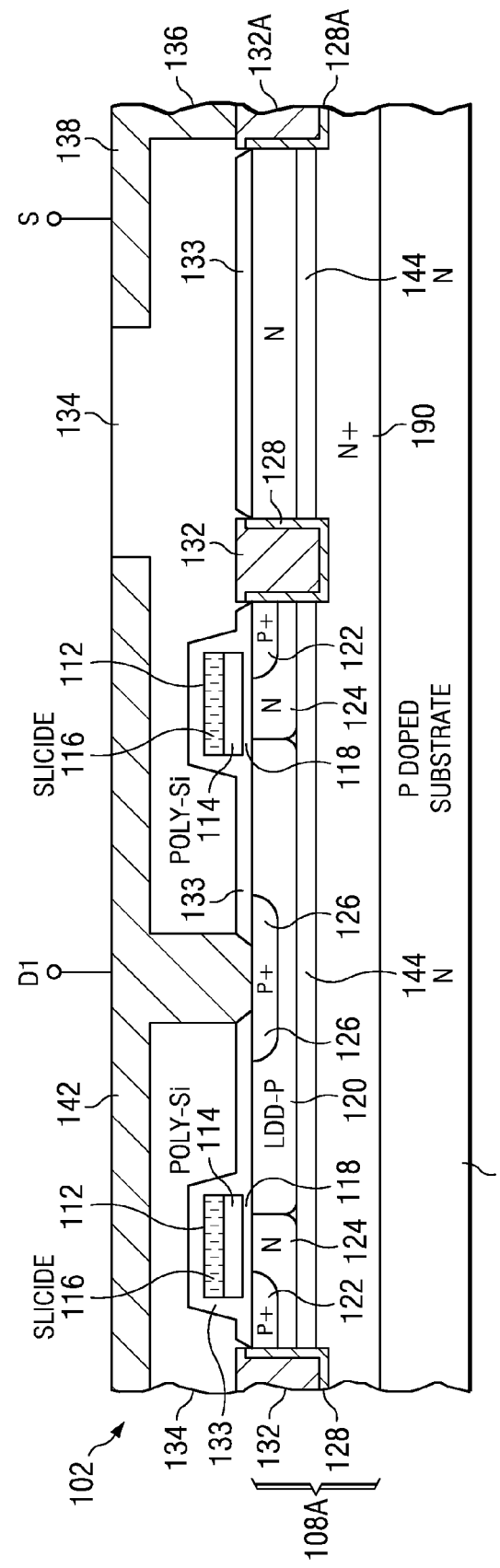
FIG. 2C is a cross-sectional view, showing a portion of FIG. 2, illustrating an alternative embodiment where the LDMOS transistors are electrically isolated from the substrate.

FIG. 2C illustrates an alternative embodiment which may be used to integrate into a single packaged device the source coupled PMOS power switch with and other device(s) formed on a substrate, or generally to isolate the PMOS power switch from the substrate. In this embodiment, the silicon substrate 106B is a non-epitaxial P-doped substrate. Epitaxial layer 108A includes a buried layer 190, which is highly doped (N+). Current from transistors 102, 104 flows laterally through the buried layer 190 into the source electrode 138 (through conductive trench liner 128A, conductive plug 132a and via 136). The transistors 102, 104 described above are formed over buried layer 190 in the remainder of the epitaxial layer. In addition to carrying the transistor current laterally, the buried layer 190 provides electrical isolation for the power switch (i.e., common-source connected LDMOS transistors 102, 104) from the substrate 106B, allowing the integration of a number of other LDMOS transistors (or other devices) over a common substrate 106B with the power switch.

The device described herein is a monolithic integration of a pair of PMOS transistors in a source-coupled connection on the same die. It should be understood, however, that more than two common source-coupled PMOS transistors can be monolithically integrated on the same die depending on device needs and size and current demands. In one such example, more than two source-coupled PMOS transistors are provided for selecting amongst more than two loads, such as more than two sub-systems of an electrical system. The device size is minimized by employing wafer level packaging techniques, i.e., by forming the solder bumps directly on the semiconductor die and eliminating the need to overmold the product with an encapsulation layer and include a leadframe and wirebonds. The PMOS transistors are integrated in the same device package while maintaining low Rds,on. The compact package is ideal for common source switch connections employed in portable battery operated devices, such as cellular phones, portable computing devices and the like, or in other operations where voltage drops in series with the switched power supply are a concern.

By way of example, for a single cell, Lithium-ion rechargeable battery, such as are common in cell phones, the battery voltage ranges from 2.5V when fully discharged to 4.2V, when fully charged. It is preferred that the power switch has a Rds,on of 100 mΩ or less when turned on, i.e., when the selected gate terminal of LDMOS 102 or 104 is pulled to the system ground. The charging supply (i.e., non-battery supply) is typically between 4.5V and 5V. Therefore, the PMOS transistors 102, 104 must be able to withstand in excess of this voltage from the source to drain terminals. Further, to prevent damage to the system when plugged directly into an automobile power receptacle, the transistors are required to withstand 20V from the source terminals to the drain terminals. A dual, common source p-channel MOSFET device as described herein has been tested by way of simulation. The device has a breakdown voltage that exceeded 20V from source to drain, and showed a 98 mΩ resistance between source and drain when 2.5V is applied from source to gate.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A rechargeable, battery operated system comprising:
a supply node;
a charger terminal;
a battery terminal; and
a power switch including a semiconductor device comprising a pair of monolithically integrated p-channel LDMOS transistors having a common source terminal, wherein said common source terminal is coupled to the supply node, wherein a drain terminal of said first LDMOS transistor is coupled to said charger terminal and a drain terminal of said second LDMOS transistor is coupled to said battery terminal, wherein said supply node is selectively coupled to said charger terminal and battery terminal based on controls signals at respective gate terminals of said LDMOS transistors.

2. The system of claim 1, wherein said semiconductor device is a flip chip semiconductor device comprising conductive bumps corresponding to said gate, drain and source terminals.

3. The system of claim 1, wherein said power switch is flip chip mounted on a printed circuit board.

4. An electronic system comprising:
a supply node;
at least first and second loads coupled in parallel; and
a power switch including a semiconductor device comprising at least a pair of monolithically integrated p-channel LDMOS transistors having a common source terminal, wherein said common source terminal is coupled to the supply node, wherein a drain terminal of said first LDMOS transistor is connected to the first load and a drain terminal of said second LDMOS transistor is connected to said second load, wherein said loads are selectively coupled to said supply node based on controls signals at respective gate terminals of said LDMOS transistors.

5. The system of claim 4, wherein said semiconductor device is a flip chip semiconductor device comprising conductive bumps corresponding to said gate, drain and source terminals.

6. The system of claim 5, wherein said power switch is flip chip mounted on a printed circuit board.

* * * * *